United States Patent [19]

Barrow et al.

[11] Patent Number: 4,885,585

[45] Date of Patent: Dec. 5, 1989

[54] RAMP GENERATOR RESET CIRCUIT

[75] Inventors: Jeffrey G. Barrow, Oak Ridge, N.C.; Adrian P. Brokaw, Burlington, Me.

[73] Assignee: Analog Devices, Inc., Norwood, Me.

[21] Appl. No.: 189,290

[22] Filed: May 2, 1988

Related U.S. Application Data

[62] Division of Ser. No. 945,654, Dec. 23, 1986, Pat. No. 4,742,331.

[51] Int. Cl.[4] .............................................. H03M 1/56
[52] U.S. Cl. ................................... 341/169; 307/272.2
[58] Field of Search ..................... 307/227, 228, 272.1, 307/272.2, 490; 341/155, 166, 169, 170

[56] References Cited

U.S. PATENT DOCUMENTS 3,042,815  7/1962  Campbell, Jr. .................... 307/272.2

OTHER PUBLICATIONS

Eugene R. Hnatek, "A User's Handbook of D/A and A/D Converters", 1976, pp. 246-251.

Primary Examiner—William M. Shoop, Jr.
Assistant Examiner—Marc S. Hoff
Attorney, Agent, or Firm—Wolf, Greenfield & Sacks

[57] ABSTRACT

A ramp voltage generator which utilizes a simple resistance/capacitance charging circuit to generate a linear ramp voltage is reset by means of a shorting transistor connected across the capacitor. The shorting transistor is, in turn, controlled by the output of a flip-flop that responds to set and reset signals applied to the circuit. In order to decrease the overall reset time of the circuit and thereby increase the operational frequency, a current switch is provided which bypasses the flip-flop and immediately diverts current to the shorting transistor upon the application of a reset signal to the circuit.

15 Claims, 3 Drawing Sheets

RAMP GENERATOR RESET CIRCUIT

This application is a division of application Ser. No. 945654, filed 12/23/86 now U.S. Pat. No. 4,242,331.

FIELD OF THE INVENTION

This invention relates to reset circuitry for resistance capacitance voltage ramp generators.

BACKGROUND OF THE INVENTION

In modern computer control systems, it is frequently necessary to reset convert a digital signal (which is used internally in the computer) to a variety of analog signals which are used to directly control or measure the environment. Two conversion devices which are ofter used in manufacturing systems are digital-to-analog converters (DACs) and analog-to-digital converters (ADCs). These units convert between analog signals generated by the environment and the digital signals used by the computer.

Another, perhaps less widely used, conversion device is a digital-to-time converter. This unit accepts a digital signal and produces a proportional time delay. The delay usually appears as a time difference between two pulses appearing at the output of the device or between a trigger pulse and a pulse appearing at the output of the device. Such programmable time delay circuits are often used in automated test equipment and are used to delay digital signals.

Digital-to-time converters have conventionally been fabricated from discrete semiconductor devices. In such devices, the conversion is often performed by comparing a linearly-increasing voltage or current ramp signal to a threshold voltage or current. In one conventional form of a digital-to-time converter, a fixed threshold voltage is set by a precision voltage reference source and the time delay is generated by comparing the threshold voltage to a ramp with a variable slope. The slope of the ramp is set by the value of the digital word to program the device. In another conventional form of the converter, a ramp with a fixed slope is generated and the time delay is obtained by comparing the ramp voltage to a variable threshold whose level is set in accordance with input digital word.

In either of the above variations, when the value of the ramp voltage equals the value of the threshold voltage a pulse signal is generated. If a pulse signal is generated at the start the ramp signal, the time elapsing between the two pulse signals represents a delay which depends on the value of the digital input word. The starting pulse may also be the trigger pulse which is used to start the ramp signal generation.

In a conventional digital-to-time converter designed with discrete devices, the internal ramp signal is created by charging a capacitor with a stable current generated by placing a precision voltage reference source across a precision resistor. Once a stable charging current has been established, the voltage across the capacitor provides a stable ramp output.

Such a ramp generator is usually reset by means of a shorting transistor connected in shunt across the capacitor. When the shorting transistor is turned "on", the voltage across the capacitor is returned to zero, resetting the circuit. The shorting capacitor is normally controlled by the output of a flip-flop or other memory circuit which determines whether the circuit is operational or rest in response to the application of set or reset signals.

The problem with the conventional arrangement is that the reset signal which operates the flip-flop must propagate through the flip-flop to turn on the shorting transistor and reset the circuit. Since the flip-flop contains many transistors and other elements, the time consumed between the receipt of a reset signal at the flip-flop input and the actuation of the shorting transistor is usually significant and thus the reset time of the entire circuit is increased by the propagation delay of the flip-flop. Since the reset time of the circuit is a substantial portion of the operating cycle of the circuit, the entire operational frequency is reduced.

Accordingly, it is an object of the present invention to provide a reset circuit for a ramp generator which can operate at high speed.

It is another object of the present invention to provide a reset circuit for a ramp generator in which the reset function operates at a higher speed than conventional circuits.

It is yet a further object of the present invention to provide a reset circuit for a ramp generator which can be easily fabricated in a monolithic integrated circuits.

It is yet a further object of the present invention to provide a reset circuit for a ramp generator which can be easily intergated with existing control circuitry.

SUMMARY OF THE INVENTION

The foregoing objects are achieved and the foregoing problems are solved in one illustrative embodiment of the invention in which a current switch is connected to the shorting transistor. The current switch is directly actuated by a reset signal and immediately diverts current to the shorting transistor causing the circuit to reset. The current switch holds the circuit in the reset condition until the flip-flop changes state in order to maintain the circuit reset.

More particularly, the shorting transistor is connected to a bias circuit which normally provides base current to turn the transistor "on". During circuit operation, in order to hold the shorting transistor "off", the shorting transistor base current is drawn away from the shorting transistor by means of a control transistor which is located in the output circuitry of the flip-flop. The control transistor acts as a current switch to divert the shorting transistor base current to ground.

In accordance with the invention, a second current switch is connected in series with the control transistor. This second current switch is directly responsive to a reset signal applied to the circuit. When a reset signal is applied, the second current switch opens and allows the bias circuit to immediately apply base current to the shorting transistor. The shorting transistor thereupon turns "on" and resets the circuit. Subsequently, the flip-flop changes state to maintain the circuit in the reset state.

In order to allow the reset circuitry to be fabricated as a monlithic integrated circuit, both the control transistor and the second current switch are fabricated as pair of emitter-coupled transistors connected to a current source. This conventional arrangement allows current to be switched between circuit elements without changing the overall current flow through the system.

DETAILED DESCRIPTION OF THE PREFERRED EMBODIMENT

An illustrative digital-to-time converter has a TRIGGER input, a RESET input, a minimum delay output and a programmed delay output. The TRIGGER input accepts a positive-going-edge signal to trigger the circuit. Internal circuitry prevents an erroneous re-triggering until the circuit function has been completed. After the circuit has been triggered, and after a propagation delay, a pulse appears at the minimum delay output. This pulse is used in the same fashion as analog ground in a digital-to-analog converter to reference the zero state (zero time delay in the present circuit). Subsequently, after a programmed time delay depending on the values of the digital input word (on leads B1–B8), a second pulse appears at the programmed delay output. The time elapsing between the two pulses represents the time delay generated by the device. The RESET input is dominant over the TRIGGER input. In the presence of a RESET input the device cannot be triggered and, if already triggered, it resets.

Figure 1:
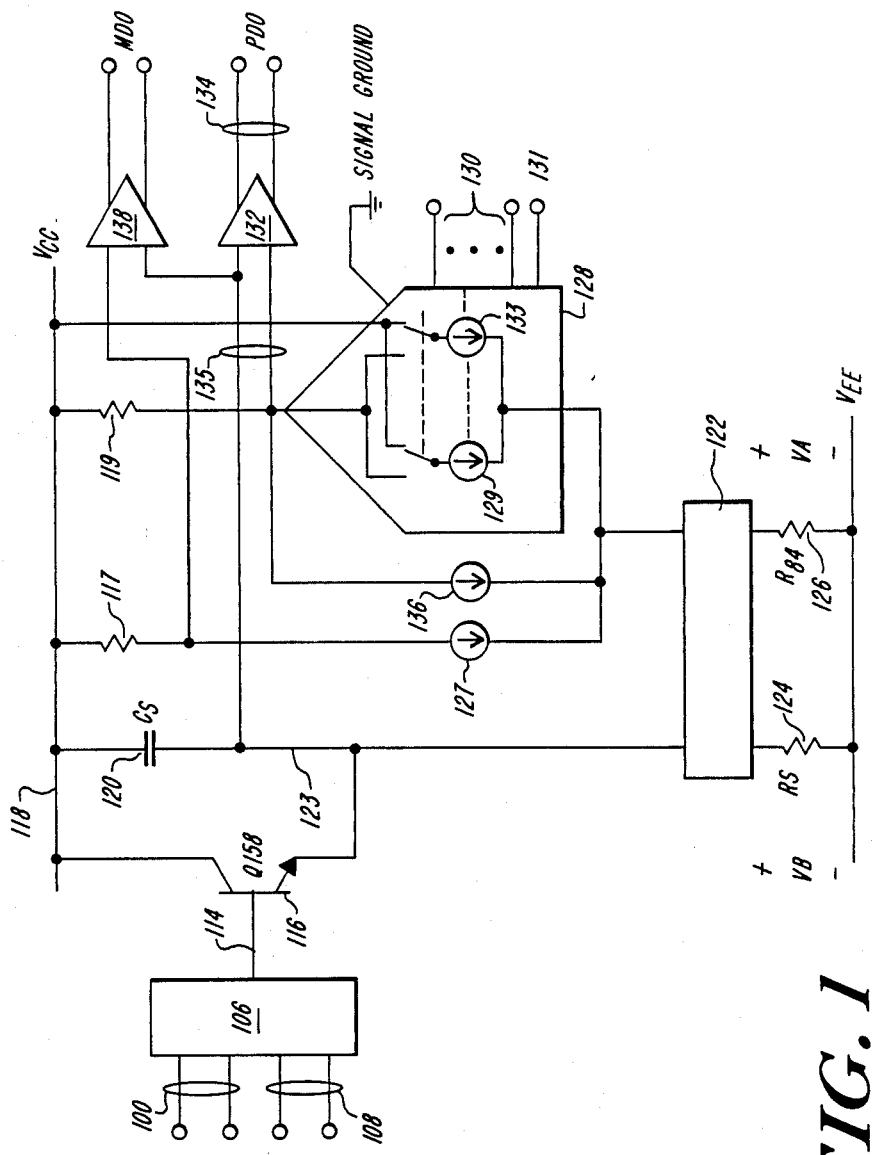
FIG. 1 is a block schematic diagram of the inventive digital-to-time converter circuit.

More particularly, as shown in FIG. 1, the device accepts a differential, or single-ended, emitter-coupled-logic (ECL) signal applied to its TRIGGER input 100. The TRIGGER signal on lead 100 is applied to input and ramp start circuitry 106. Upon a rising edge being detected, the ramp start circuitry controls the charging of capacitor 120 which, as will hereinafter be described, generates the ramp voltage used to generate the programmed time interval.

Circuitry 106 also responds to signals on the RESET leads 108, but contrary to the operation of the TRIGGER portion of the circuit, circuit 106 is designed to be sensitive to the level of the RESET signal rather than the signal edges. When a "high" RESET signal is applied to the RESET leads 108, the charging of capacitor 120 is terminated and the circuit is reset regardless of the state of the TRIGGER inputs or the state of the circuit.

When the ramp start circuitry is activated, it removes the base drive signal on lead 114 which is normally applied to transistor 116 (transistor 116, in the quiescent state, is normally "on" and short circuits timing capacitor 120). However, when the ramp start circuitry is activated, it applies a "low" signal to the base of transistor 116 which turns "off" the transistor. Capacitor 120 then begins charging from VCC, 118, through voltage coupling circuit 122 and resistor 124.

As will be hereinafter described in detail, circuit 106 is designed to accelerate the turn-on of transistor 116 when a reset signal is sensed so that the reset time of the circuit is minimized. Since the reset time is an appreciable part of the overall cycle time, high-speed operation is facilitated.

The voltage across capacitor 120 is compared, by comparator 138, to a minimum delay voltage to generate the minimum delay output. The minimum delay voltage is generated across resistor 117. The voltage appearing across resistor 117 is determined by the voltage coupling circuit 122 which will be described in detail below. In the quiescent state of the circuit, a current source, 127, create an "offset" that maintains the output comparator 138 in an "off" state to avoid an indeterminate state at the output. However, as capacitor 120 charges, the voltage across it quickly exceeds the offset voltage and comparator 138 shifts to a "high" MDO signal indicating a minimum propagation delay through the device. As previously mentioned, the "high" MDO signal can be used as a zero-time reference in a manner similar to the use of analog ground as a zero-voltage reference for a conventional digital-to-analog converter.

The voltage across capacitor 120 increases as the capacitor charges and, eventually, generates a programmed delay output (PDO) signal. The PDO signal on leads 134 is generated by comparator 132 which has inputs 135 which are, in turn, connected to timing capacitor 120 and to a threshold circuit which comprises DAC 128 resistor 119 and current source 127.

DAC 128 accepts TTL signals representing a digital word on its inputs 130. This digital word is latched into converter 128 by means of a level-sensitive latch signal appearing on lead 131. The DAC effectively appears as a plurality of parallel-connected, binary-weighted current sources 129. In response to the digital word, converter 128 connects these current sources either to supply voltage 118 or resistor 119. The current running through each of the parallel sources is determined by components in the DAC and in voltage coupling circuit 122 so that the total DAC current is independent of the digital word. The portion of the current running through the resistor 119 is determined by the value of the digital word and is also proportional to the total DAC current since it is comprised of the current running through selected ones of the parallel-connected sources. The current running through resistor 119 causes a threshold voltage to develop at point 125, the value of which is dependent on the combination of current sources connected to resistor 119, which combination is, in turn, dependent on the value of the digital word and on the total DAC current.

The total current running through the DAC is determined by internal DAC components, components in voltage coupling circuit 122 and resistor 126. In particular, the DAC current runs through reference resistor 126 to create a reference voltage VA, and, accordingly, the voltage VA is representative of the changes in the DAC current caused by thermal and supply variations. Since the current running through the resistor 119 is proportional to the total DAC current, the threshold voltage appearing across resistor 119 is proportional to the reference voltage VA and variations in the threshold voltage caused by thermal and supply variations are represented by variations in the reference voltage VA.

Voltage coupling circuit 122 is arranged to force the voltage, VB, appearing across ramp resistor 124 to be equal to the reference voltage VA. Thus, the charging current to the ramp generating capacitor 120 and the resulting ramp voltage is dependent on the voltage VB, which is equivalent to reference voltage VA. Thus, variations in the internal threshold voltage appearing across resistor 119 appear as corresponding variations in the ramp voltage. Since both the threshold voltage appearing at point 125 and the ramp voltage appearing at point 123 are applied to differential comparator 132, any variations in the voltages due to temperature changes, power supply variations or component variations appears as a common mode signal to differential comparator 132 and are rejected.

Comparator 132 develops an output when the ramp voltage at point 123 reaches the threshold voltage at point 125. At that point, a "high" signal appears on leads 134 which "high" signal indicates the programmed time delay from the occurrence of the MDO signal (or the trigger signal).

As with the circuit that generates the MDO signal, an offset current source 136 is connected to point 125. Current source 136 maintains comparator 132 in its "off" state in the absence of signals from capacitor 120 and converter 128.

Figure 2:
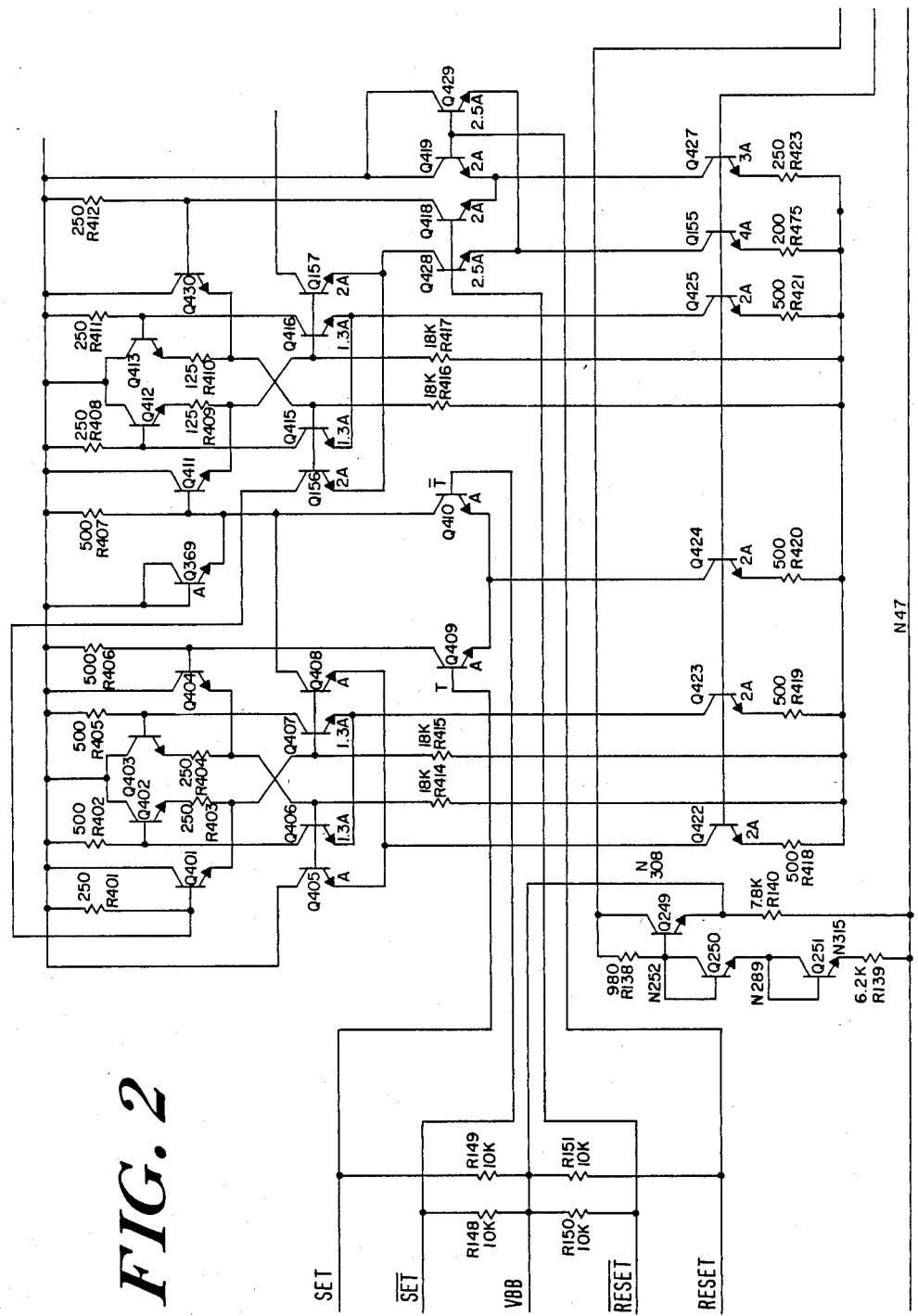
FIG. 2 is a detailed electrical schematic diagram of the trigger/reset flip-flop circuitry.

FIG. 2 shows a detailed electrical schematic of the TRIGGER/RESET flip-flop and input signal comparator circuitry. As previously mentioned, the TRIGGER/RESET flip-flop is designed so that the TRIGGER input is rising-edge sensitive and the RESET input is level sensitive and dominates over the TRIGGER input. The circuitry is arranged so that either single-ended or differential inputs can be used. In the case of a single-ended input, the unused input is pulled by internal resistors to the emitter-coupled logic (ECL) midpoint voltage (VBB). For example, for single-ended operation of the SET input, resistor R148 pulls the SET* input to the midpoint voltage VBB.

Midpoint voltage VBB is established by transistor Q249. More particularly, the base of transistor Q249 is held at a potential between gorund and the negative supply (VEE) by means of a voltage divider consisting of resistor R138, diodes Q250 and Q251 and resistor R139. The emitter of transistor Q249 thus establishes the ECL midpoint voltage by means of current running through resistor R140. It should be noted that some transistors have a notation "A" next to the transistor symbol. This notation refers to the relative emitter area. Thus, a transistor with a notation of 2A has twice the emitter area of a transistor with the notation "A". An absence of a notation denotes a transistor with an area equivalent to a transistor with a notation of "A".

A "high" signal applied to the SET input triggers the device. This "high" signals is applied to the base of transistor Q409. Transistors Q409 and Q410 are connected in a well-known emitter-coupled differential circuit. In this circuit, the emitters of both transistors are tied to a current source which conducts a predetermined amount of current. More specifically, the current source consists of transistor Q424. The base of transistor Q424 is connected to a voltage source whose output is driven by transistor Q203 (shown in FIG. 4). Consequently, the emitter of transistor Q424 is fixed at a predetermined potential and a predetermined, constant current is drawn through resistor R420 to the negative supply voltage, VEE.

Returning to the emitter-coupled differential pair, Q409 and Q410, in accordance with conventional operation, when transistor Q409 turns "on", it conducts the entire current drawn by the current source. Thus, transistor Q410 is turned "off".

With transistor Q410 turned "off", resistor R407 pulls the base of transistor Q411 "high", turning "on" transistor Q411. Turned-on transistor Q411 applies a "high" signal to the base of transistor Q416, in turn, turning it "on". Transistors Q412, Q413, Q415 and Q416 are connected in a flip-flop configuration and, when transistor Q416 turns "on" it pulls the base of transistor Q413 "low", which, in turn, pulls the base of transistor Q415 "low", turning it "off".

When transistor Q415 turns "off", it allows resistor R408 to pull the base of transistor Q412 "high" and turn "on" transistor Q412, which transistor maintains transistor Q416 in an "on" state.

The base of transistor Q157 is also tied to the base of transistor Q416 so that, when the Q412–Q416 flip-flop is set, transistor Q157 is also turned "on". As will hereinafter be described, the collector of transistor Q157 is connected to the ramp generator circuitry so that ramp generation begins when transistor Q157 is turned "on".

At the time when the Q412–Q416 flip-flop is "set", both transistors Q415 and Q156 (connected in parallel to transistor Q415) are turned "off". When transistor Q156 turns "off", it allows resistor R401 to pull the base of transistor Q401 "high". This latter action sets a flip-flop consisting of transistors Q402, Q403, Q406 and Q407. When the Q402–Q407 flip-flop is "set", it turns Q408 "on" which pulls the base of transistor Q411 "low". Transistor Q411 is thus inhibited, to prevent improper re-triggering of TRIGGER input.

As previously mentioned, a RESET signal applied to the RESET input overrides the signals applied to the TRIGGER inputs. Thus, if a "high" RESET signal is applied to the RESET inputs, the converter circuit cannot be triggered and, if the converter circuit had already been triggered, the circuit is reset.

In accordance with the invention, the reset circuitry is designed to rapidly turn off transistor Q157, thus resetting the circuit. This rapid turn off is accomplished by immediately depriving transistor Q157 of collector current upon the occurrence of a RESET signal. Subsequently, the triggering flip-flops are reset to maintain the circuit in a reset condition. More particularly, a "high" signal applied to the RESET input is applied to the base of transistor Q429 turning it "on". Transistors Q428 and Q429 are connected in an emitter-coupled differential pair and, thus, transistor Q428 turns "off" when transistor Q429 turns "on". When transistor Q428 turns "off", it deprives transistor Q157 of collector current (since the current for transistors Q156 and Q157 passes through transistor Q428) and transistor Q157 immediately turns "off" resetting the ramp generation circuitry.

In addition, the "high" RESET signal is applied to the base of transistor Q419 turning it "on". Transistors Q418 and Q419 are also connected in an emitter-coupled differential pair and, thus, transistor Q418 turns "off". This latter action allows resistor R412 to pull the base of transistor Q430 "high", resetting the Q412–Q416 flip-flop and maintaining the circuit in the reset condition. When the Q412–Q416 fil-flop is reset Q408 is also turned "on", which action pulls the base of Q411 "low", in turn, inhibiting trigger pulses from retriggering the system.

Figure 3:
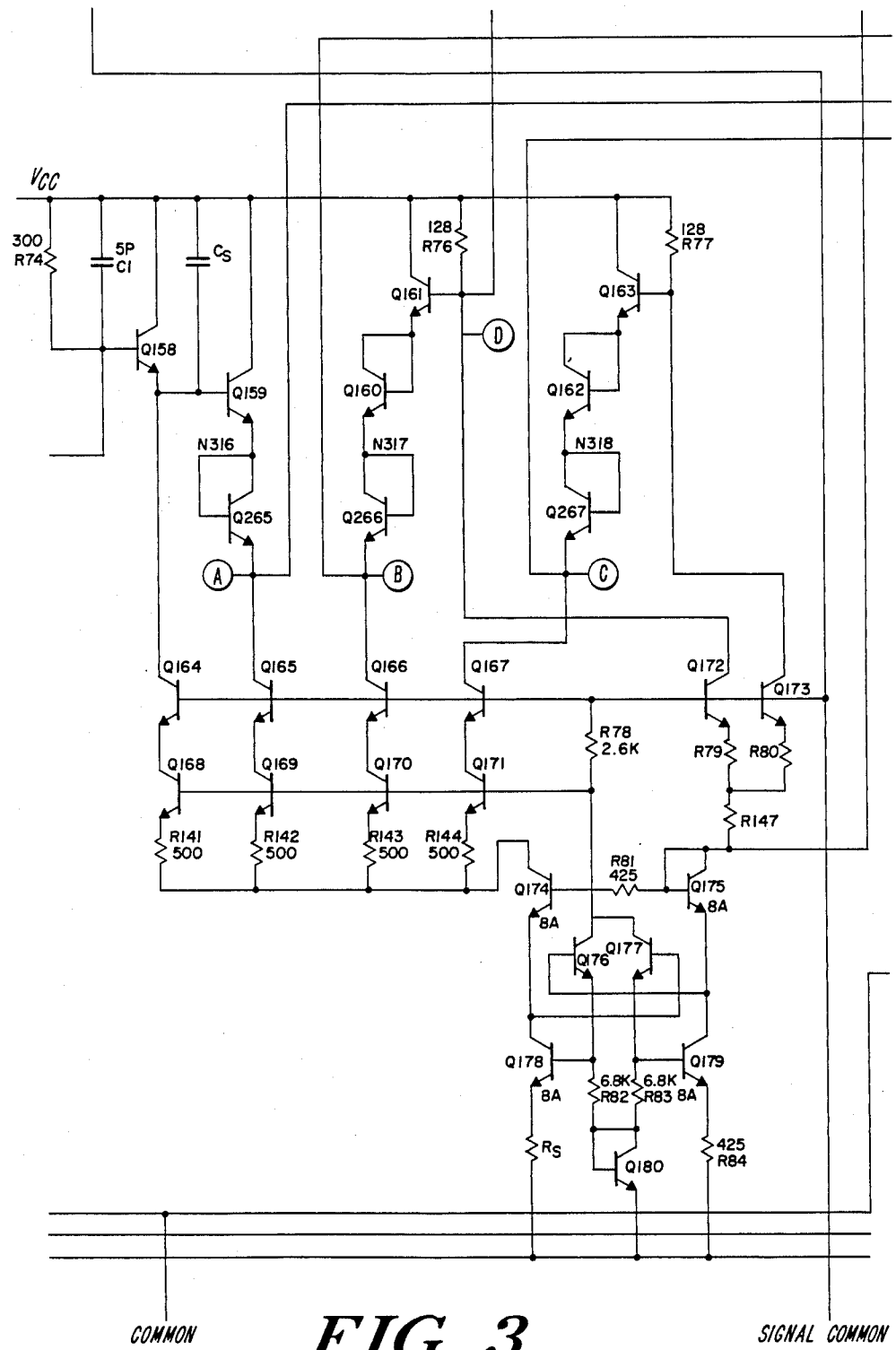
FIG. 3 is a electrical schematic diagram of the ramp generator.

The ramp generator and inventive voltage coupling circuit is shown in detail in FIG. 3. The Ramp generator circuit consists of timing capacitor $C_s$ and timing resistor $R_s$. The voltage coupling circuit consists of transistors Q174–Q180. Ramp generation begins when the TRIGGER/RESET flip-flop is "set" as previously described. More particularly, when transistor Q157 (FIG. 2) turns "on", the base of transistor Q158 is pulled "low" turning the latter transistor "off". Transistor Q158 normally shorts timing capacitor $C_s$. Therefore, when transistor Q158 turns "off", it allows capacitor $C_s$ to begin charging from VCC, through transistors Q164, Q168, resistor R141, Q174, Q178 and timing resistor $R_s$ to the supply voltage VEE.

Transistors Q164 and Q168 act as part of a current divider, however, transistors Q174 and Q178 act, as will hereinafter be described, to insure that the timing capacitor charging current tracks variations in the DAC current caused by thermal and supply variations and, accordingly, that the ramp voltage tracks the threshold voltage.

A capacitor, C1, is connected to the base of transistor Q158 to delay the rise of the base voltage of transistor Q158 during reset of the ramp generator when control transistor Q157 (FIG. 2) turns "off". The small delay produced by capacitor C1 is necessary to prevent transistor Q158 from going into saturation as it charges capacitor $C_s$ during reset operation. Capacitor C1 thus speeds the ramp reset cycle.

The ramp voltage developed across capacitor $C_s$ is applied to the base of transistor Q159 which acts as an emitter follower. From the emitter of transistor Q159 the ramp signal is applied through diode Q265 to point A. The signal at point A is one of the signals which is provided to the output comparator. In order to convert the ramp voltage into a time delay, the ramp voltage is compared to a threshold voltage which is generated by a DAC. The DAC threshold voltage appears at the base of transistor Q161 and is applied through transistor Q161 (which acts as emitter follower) and diodes Q160 and Q266 to point B. The signal at point B acts is compared to the signal at point A by the output comparator. Since the ramp slope, the initial ramp starting voltage and the threshold voltage are known, a predictable delay can be generated.

More particularly, the threshold voltage is generated by a current drawn through resistor R76 by the DAC. The DAC converts the value of a digital word into a predetermined current flow through resistance R76 by selectively connecting internal current sources either to resistor R76 or to the power supply. The internal DAC current sources are weighted as binary submultiples of the total DAC current which is independent of the value of the digital word. Accordingly, although the value of the threshold voltage depends on the exact combination of current sources connected to resistor R76, it will always be proportional to the total DAC current. The total DAC current flows from the DAC through the voltage coupling circuit path consisting of transistors Q175 and Q179 and the reference resistor R84 to the supply voltage VEE. Accordingly, the voltage across the reference resistor R84 is proportional to the threshold voltage.

In the illustrative embodiment shown in FIGS. 2-3, resistor values are noted next to each resistor. The values are given in ohms with the notation "K" equivalent to a multiplier of 1000. Capacitor values are given in picofarads. The transistors are of standard NPN configuration.

What is claimed is:

1. In a ramp generator circuit having a capacitor which is charged to generate a ramp voltage, a shorting transistor, having base, emitter and collector leads, which shorting transistor is connected across said capacitor to electrically short said capacitor to reset said ramp generator circuit, means connected to said base lead of said shorting transistor for supplying current to said base lead to turn said transistor on, a first current switch connected to the base lead of said shorting transistor to draw current away from the base lead and switch said shorting transistor off and a flip-flop for controlling the operation of said first current switch, a high-speed reset circuit responsive to a reset signal comprising, a second current switch connected in series with said first current switch, which second current opens in direct response to said reset signal, thereby allowing said current supply means to turn on said shorting transistor and reset said ramp generator circuit.

2. In a ramp generator circuit, the reset circuit according to claim 1 wherein said second current switch comprises a pair of transistors, each of said pair of transistors having emitters, said emitters being coupled together and a current source connected to said emitters.

3. In a ramp generator circuit, the reset circuit according to claim 2 wherein a collector of a first one of said pair of transistors is connected to said base of said shorting transistor to draw current away from said shorting transistor.

4. In a ramp generator circuit, the reset circuit according to claim 3 wherein a base of a second one of said pair of transistors is responsive to said reset signal to cause said first one of said pair of transistors to turn off thereby preventing current from being drawn away from said shorting transistor.

5. In a ramp generator having a capacitor which is charged to generate a ramp voltage, a shorting transistor shunting said capacitor to electrically short said capacitor and reset said ramp generator, and memory means for controlling said shorting transistor to turn said transistor on and off, a high-speed reset circuit responsive to a reset signal comprising:

a current switch connected to said shorting transistor, and means for operating said current switch directly in response to said reset signal in order to divert current to enable said shorting transistor to turn on and reset said ramp generator.

6. In a ramp generator, the reset circuit according to claim 5, wherein said current switch is connected to said shorting transistor.

7. In a ramp generator circuit, the reset circuit according to claim 6 wherein said current switch comprises a pair of transistors, each of said pair of transistors having emitters, said emitters being coupled together and a current source connected to said emitters.

8. In a ramp generator circuit, the reset circuit according to claim 7 wherein a collector of a first one of said pair of transistors is connected to said base of said shorting transistor to draw current away from said shorting transistor.

9. In a ramp generator circuit, the reset circuit according to claim 8 wherein a base of a second one of said pair of transistors is responsive to said reset signal to cause said first one of said pair of transistors to turn off thereby preventing current from being drawn away from said shorting transistor.

10. A voltage ramp generator circuit comprising:
a capacitor;
means for charging said capacitor to generate a ramp voltage;
a shorting transistor shunting said capacitor to electrically short said capacitor and reset said voltage ramp generator circuit;
memory means for controlling said shorting transistor to turn said transistor on and off;
a first current switch connected to said shorting transistor, and
means for operating said first current switch directly in response to said reset signal in order to divert current to enable said shorting transistor to turn on and reset said voltage ramp generator circuit.

11. A voltage ramp generator circuit according to claim 10, further comprising means for providing current to said shorting transistor to bias said shorting transistor on and wherein said memory means comprises a flip-flop and a second current switch controlled by said flip-flop, said second current switch being operable to divert current away from said shorting transistor to turn said shorting transistor off.

12. A voltage ramp generator circuit according to claim 11 wherein said first current switch and said second current switch are connected in series.

13. A voltage ramp generator circuit according to claim 12 wherein said second current switch comprises a pair of transistors, each of said pair of transistors having emitters, said emitters being coupled together and a current source connected to said emitters.

14. A voltage ramp generator circuit according to claim 13 wherein a collector of a first one of said pair of transistors is connected in series with said first current switch to control current passing through said first current switch.

15. A voltage ramp generator circuit according to claim 14 wherein a base of a second one of said pair of transistors is responsive to said reset signal to cause said first one of said pair of transistors to turn off thereby interrupting current flowing through said first current switch.

* * * * *

UNITED STATES PATENT AND TRADEMARK OFFICE
CERTIFICATE OF CORRECTION

PATENT NO. : 4,885,585

DATED : Dec. 5, 1989

INVENTOR(S) : Jeffrey G. Barrow, Adrian P. Brokaw

It is certified that error appears in the above-identified patent and that said Letters Patent is hereby corrected as shown below:

On the title page:
Item [75]
The address of inventor Adrian P. Brokaw is
--Burlington, MA--.
Item [73]
The address of assignee Analog Devices, Inc. is
--Way, Norwood, MA--

Signed and Sealed this

Sixteenth Day of October, 1990

Attest:

HARRY F. MANBECK, JR.

*Attesting Officer*     *Commissioner of Patents and Trademarks*